United States Patent [19]
Chiba et al.

[11] Patent Number: 5,029,298
[45] Date of Patent: Jul. 2, 1991

[54] TRANSMITTER CIRCUIT

[75] Inventors: Yutaka Chiba, Katsuta; Kunihiro Hamada, Kawasaki, both of Japan

[73] Assignee: Hitachi, Ltd., Tokyo, Japan

[21] Appl. No.: 454,636

[22] Filed: Dec. 21, 1989

[30] Foreign Application Priority Data

Dec. 22, 1988 [JP] Japan ................. 63-321903

[51] Int. Cl.$^5$ .................................. H03G 3/30
[52] U.S. Cl. ...................... 330/285; 330/277; 455/127
[58] Field of Search .......... 330/133, 134, 277, 285; 379/58, 61; 455/95, 116, 127

[56] References Cited

U.S. PATENT DOCUMENTS 3,866,136 2/1975 Augustin et al. ............ 455/127 X
4,523,155 6/1985 Walczak et al. ............ 330/279

FOREIGN PATENT DOCUMENTS 163407 7/1987 Japan.
884459 12/1961 United Kingdom.

*Primary Examiner*—James B. Mullins
*Attorney, Agent, or Firm*—Antonelli, Terry, Stout & Kraus

[57] ABSTRACT

A transmitter circuit useful for example, in a portable radio-telephone comprises a power amplifying circuit which includes a driving amplifier constituted by a Si-MOSFET element and a power amplifier constituted by a GaAs-FET element. The gate voltage control is performed simultaneously for the driving amplifier and the power amplifier. By virtue of this mixed arrangement, a transmitting power amplifying circuit having a high power conversion efficiency is realized inexpensively.

11 Claims, 4 Drawing Sheets

TRANSMITTER CIRCUIT

BACKGROUND OF THE INVENTION

The present invention generally relates to a transmitter circuit used in a portable radiotelephone, portable wireless telephone or the like. More particularly, the invention is concerned with a transmitter circuit having such a circuit configuration which is suited advantageously for the power control of a power amplifier having two voltage lines of positive (plus) and negative (minus) polarities for the output power control.

In the portable radiotelephone or portable wireless telephone (hereinafter collectively referred to as portable radiotelephone) known heretofore, a power amplifier and a driving amplifier for driving the same are realized by using bipolar elements of Si (silicon). In recent years, however, there has been an increasing tendency of employing power amplifiers which are realized by using a GaAs-FET having a high power conversion efficiency with a view to miniaturizing the portable radiotelephone to obtain light weight.

However, the GaAs-FET involves high expenditure when compared with the Si-element, and it is not only uneconomical but also unreasonable to exclusively use the GaAs-FETs for both the driving amplifier and the power amplifier.

Now representing the additive efficiency of the driving amplifier by $\eta_d$, that of the power amplifier by $\eta_p$ and the overall or combined additive efficiency of the driving amplifier and the power amplifier by $\eta_t$, the following relation applies:

$$\eta_t = \frac{1 - 10^{-\frac{Gd+Gp}{10}}}{\frac{1}{\eta_d} \cdot 10^{-\frac{Gp}{10}} \cdot (1 - 10^{-\frac{Gd}{10}}) + \frac{1}{\eta_p}(1 - 10^{-\frac{Gp}{10}})} \times 100 \quad (1)$$

where Gd represents the gain (dB) of the driving amplifier and Gp represents that of the power amplifier.

FIG. 5 of the accompanying drawing illustrates graphically a relation between the additive efficiency $\eta_d$ of the driving amplifier and the overall or total additive efficiency $\eta_t$. As can be seen from the figure, the additive efficiency $\eta_d$ of the driving amplifier presents substantially no contribution to the total additive efficiency $\eta_t$, when the gain of the power amplifier is higher than that of the driving amplifier and when the additive efficiency $\eta_d$ of the driving amplifier is higher than 30%.

For the reason described above, it is considered unnecessary to use the GaAs-FET elements for both the driving amplifier and the power amplifier. In other words, there can be conceived such an approach that the conventional Si-element is used for the driving amplifier while the GaAs-FET having a high power conversion efficiency is used for the power amplifier which has a significant influence to the overall additive efficiency $\eta_t$.

By the way, in the cellular radio system inclusive of the portable radiotelephone and the movable phone system, the output power of the ratiotelephone must be controlled in response to a command sent from a base station in dependence on the operating state of the radiotelephone (e.g. in dependence on the distance from the base station).

It is now supposed that an N-MOSFET of Si is used for the driving amplifier with the GaAs-FET being used for the power amplifier.

In this case, as the means for controlling the output power of the radiotelephone, there can be mentioned among others (1) a method of controlling a gate voltage of either one of the driving amplifier and the power amplifier (first method), (2) a method of controlling the gate voltages of both the driving amplifier and the power amplifier (second method), (3) a method of controlling a power source voltage for either one of the driving amplifier and the power amplifier (third method), and (4) a method of controlling the source voltages for both the driving amplifier and the power amplifier (fourth method).

Considering the four control methods mentioned above in comparison with one another, it is noted that the first method can not assure the power control in a satisfactory manner. The third and fourth methods are disadvantageous in that the power source voltage control involves high power consumption in a power control circuit provided to this end. The second method is most preferred because it can ensure sufficient power control with a low power consumption in the power control circuit.

FIG. 6 of the accompanying drawings shows control characteristics of the driving amplifier realized by using a N-MOSFET, and FIG. 7 shows a control characteristic of the power amplifier realized by using a GaAs-FET. As can be seen from these characteristic curves, the gate voltage of an N-MOSFET constituting the driving amplifier is a positive or plus voltage in a range of 0 to about 5 volts.

On the other hand, the gate voltage of a GaAs-FET of the power amplifier is a negative or minus voltage which must be variable within a range of $-4$ to $-3$ volts.

Consequently, the power control circuit has to be imparted with a function capable of regulating simultaneously both the positive or plus control voltage and the negative or minus control voltage.

A typical example of the transmitter circuit of a radiotelephone known heretofore in which the driving amplifier and the power amplifier are all realized by using the Si-elements is disclosed in JP-A-62-163407 in FIG. 1 which is annexed hereto as FIG. 4.

The transmitter circuit shown in FIG. 4 operates in the following manner. FIG. 4 shows a part of a transmitting part of a cellular wireless telephone, and a signal from a voltage controlled oscillator 31 is amplified to be a predetermined output by a transmitting power amplifier 32 and is radiated in the air by an antenna 34. At this time a part of the output of the transmitting power amplifier 32 is rectified by a detector diode 37 to be subsequently supplied to a logarithmic conversion circuit 56 having the output connected to a minus input terminal k of a comparator 39. On the other hand, a three-bit signal which represents an output power level control signal sent from a base station is converted into an analog DC signal through a digital-to-analog or D/A converter 40 to be subsequently applied to the other terminal i of the comparator 39. By comparing the voltages applied to the terminals i and k, the comparator 39 controls the bias of a transistor 41 to thereby control the gate bias of an amplifying element 33 (an FET in this case) constituting a part of the transmitting power amplifier 32 for thereby controlling the transmitting power. When the transmitting power increases beyond a set value, potential at a terminal a rises while the potential at the output point p of the logarithmic conversion circuit 56 is lowered. As a consequence, potential at a circuit point j rises with the gate bias potential of the FET 33 being lowered, resulting in that the gate bias of the FET 33 is lowered, whereby the amplification factor of the FET 33 and hence the transmitting power are caused to lower.

As will be understood from the above description, although the transmitter circuit in which the driving amplifier and the power amplifier are both realized by using the Si elements is certainly inexpensive, it not only suffers from degradation in the power conversion efficiency but also requires a heat dissipation or sink structure of a large size because of very large amount of heat generation, thus presenting an obstacle in implementing the portable radiotelephone in a reduced size with a low power consumption. When the driving amplifier and the power amplifier are realized by using the GaAs-FET elements, the portable radiotelephone becomes very expensive, although it can enjoy a high power conversion efficiency.

SUMMARY OF THE INVENTION

It is therefore an object of the present invention to solve the problems of the prior art portable radiotelephone described above and provide a transmitter circuit for the portable radiotelephone of an improved circuit configuration which is profitably suited for miniaturized implementation with a low power consumption.

In view of the above and other objects which will be more apparent as the description proceeds, there is provided according to a general aspect of the present invention a transmitter circuit for a portable radiotelephone which comprises a driving amplifier constituted by a Si-MOSFET element, a power amplifier constituted by a GaAs-FET, a power control circuit interposed between a plus voltage source circuit and a minus voltage source circuit, and a resistor circuit composed of at least two resistors connected in series between the power control circuit and the minus voltage source circuit or between the power control circuit and the plus voltage source circuit, wherein at least two terminals of the resistance circuit are connected to the driving amplifier and the power amplifier.

Since the power amplifier realized by using the GaAs-FET has generally a higher power amplification gain when compared with the power amplifier realized by using a Si-element, the ratio of the power conversion efficiency of the driving amplifier to the total or overall additive efficiency is low, as shown in FIG. 5, as the result of which the total additive efficiency can essentially be determined by the power conversion efficiency of the power amplifier. Thus, the power conversion efficiency of the driving amplifier may be low as compared with that of the power amplifier.

The power control of the transmitter circuit of a mixed element type in which the Si element and the GaAs-FET element are used can be realized technically in the manner mentioned below.

A change in the plus voltage change $v_1$ of the power control circuit is applied intact to a control terminal of the driving amplifier. At the same time, the voltage change $v_1$ is transmitted as a change in the minus voltage to a control terminal of the power amplifier connected to the driving amplifier through the resistor circuitry in a linear relation given by an expression (2) described hereinafter.

DESCRIPTION OF THE PREFERRED EMBODIMENTS

Now, the present invention will be described in detail in conjunction with preferred or exemplary embodiments thereof by reference to the accompanying drawings.

Figure 1:
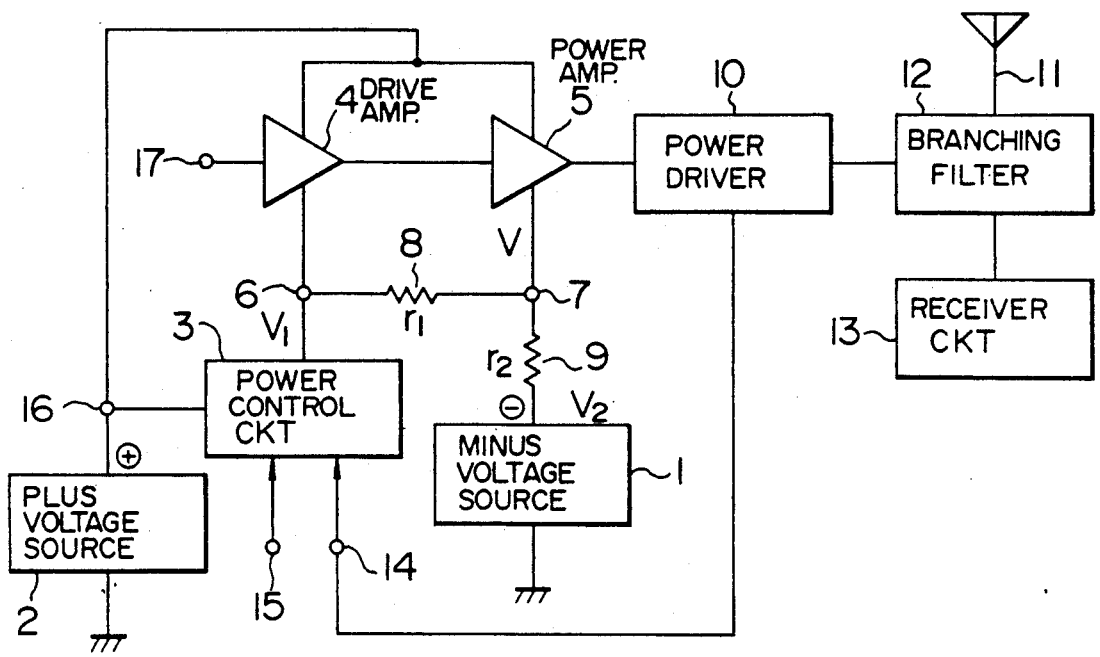
FIG. 1 is a block diagram showing a general arrangement of a transmitter circuit for a portable radiotelephone or the like according to an exemplary embodiment of the present invention.

FIG. 1 is a block diagram showing a circuit configuration of a transmitter circuit according to an embodiment of the invention.

The transmitter circuit shown in FIG. 1 is intended to be applied to a portable radiotelephone in which a power control is realized by resorting to the use of a voltage of positive or plus polarity, by way of example.

Figure 4:
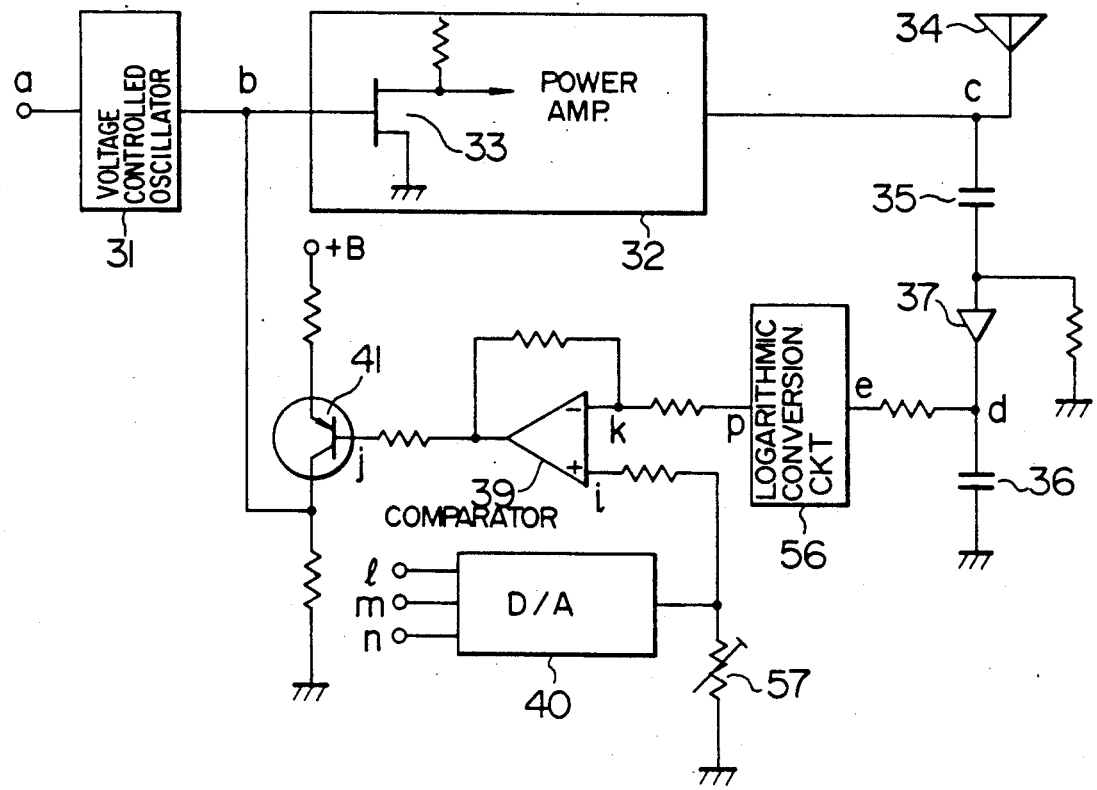
FIG. 4 is a block diagram showing a circuit configuration of a transmitter circuit known heretofore.

Describing first a general arrangement of the transmitter circuit, a reference numeral 1 denotes a minus voltage source circuit including a power supply source of negative polarity, numeral 2 denotes a plus voltage source circuit including a power supply source of positive polarity, numeral 3 denotes a power control circuit for controlling a plus source voltage, numeral 4 denotes a driving amplifier having a plus control terminal 6, numeral 5 denotes a power amplifier having a minus control terminal 7, numerals 8 and 9 denote resistors, respectively, numeral 10 denotes a power divider circuit for taking out a part of the output power for the purpose of monitoring, numeral 11 denotes an antenna, numeral 12 denotes a branching filter for separating a sending wave and a receiving wave from each other, numeral 13 denotes a receiver part, numeral 14 denotes an input terminal for the monitoring power, numeral 15 denotes an input terminal for a power level control signal derived from the signal sent from a base station, numeral 16 denotes a power source terminal, and finally a numeral 17 denotes an input terminal for a high frequency signal. The power control circuit 3 incorporates a detector, a logarithmic converter and a comparator as in the case of the power control circuit described hereinbefore in conjunction with FIG. 4 and serves substantially the same function as that of the latter.

In the arrangement shown in FIG. 1, the driving amplifier 4 is realized by using an inexpensive Si-element (N-MOSFET in the case of the illustrated embodiment), while the power amplifier 5 is realized by using a GaAs-FET exhibiting a high power conversion efficiency. In this case, a relation illustrated in FIG. 5 exists between the power conversion efficiency of the driving amplifier 4 and the total additive efficiency, as described hereinbefore.

Figure 5:
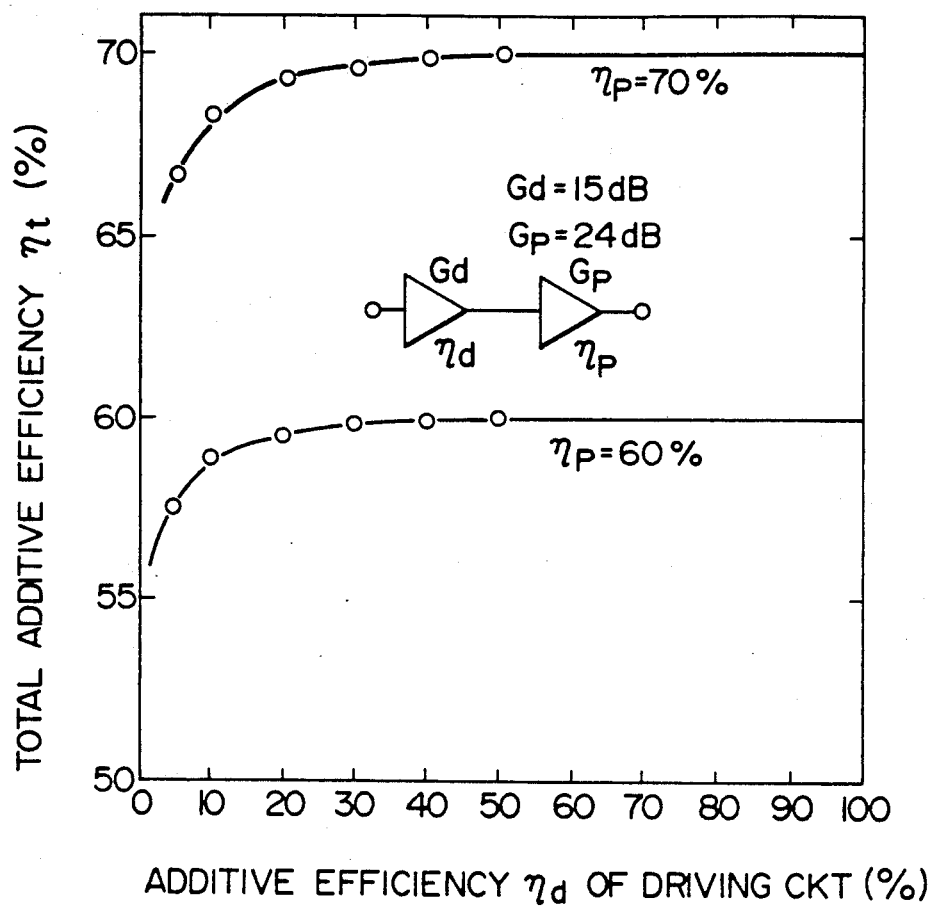
FIG. 5 is a view for illustrating graphically a relation between an additive efficiency of a driving amplifier and a total additive efficiency.

It can be seen from FIG. 5 that the total additive conversion efficiency ($\eta_t$) can be determined substantially by the additive efficiency ($\eta_p$) of the power amplifier 5. Accordingly, by realizing the driving amplifier 4 with the inexpensive Si-element, the transmitter circuit can be implemented inexpensively without sacrificing the total additive efficiency to any appreciable extent.

Now, it will be elucidated below how the minus voltage applied to the minus voltage terminal 7 can also be controlled by means of the power control circuit 3 for controlling the plus voltage.

A high frequency power signal generated by an oscillator (not shown) is applied to the high frequency power input terminal 17 to be supplied to the power divider 10 after having been amplified through the driving amplifier 4 and the power amplifier 5.

A part of the output power taken out through the power divider 10 is applied to the terminal 14 of the power control circuit 3. The power control circuit compares the signal at the terminal 14 with a control signal generated by a control circuit (not shown) incorporated in the radiotelephone in response to a command signal incoming from the base station and applied to the control input terminal 15, as the result of which a voltage $v_1$ of the control terminal 6 is controlled. At the same time, a voltage v of the control terminal 7 of the power amplifier 5 is forced to change to thereby control correspondingly the output power of the power amplifier 5.

The relation between the terminal voltages $v_1$, $v_2$ and v and resistance $r_1$ and $r_2$ can be determined in accordance with Thévenin's theorem as follows:

$$v = \frac{\frac{v_1}{r_1} + \frac{v_2}{r_2}}{\frac{1}{r_1} + \frac{1}{r_2}} \quad (2)$$

where $v_1$ represents the control terminal voltage of the driving amplifier 4, $v_2$ represents the minus voltage of the minus voltage source circuit 1, v represents the control terminal voltage of the power amplifier 5, and $r_1$ and $r_2$ represent resistances of the resistors 8 and 9, respectively.

The expression (2) shows that the control terminal voltage v of the power amplifier 5 varies linearly as a linear function of the control terminal voltage $v_1$ of the driving amplifier 4.

Figure 8:
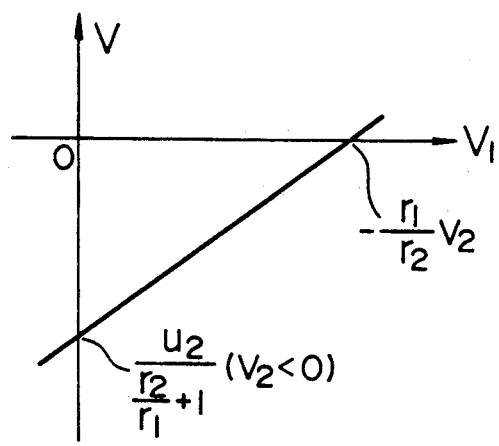
FIG. 8 graphically illustrates relation between a control terminal voltage of a driving amplifier and that of a power amplifier.

FIG. 8 graphically shows the relation between the control terminal voltage $v_1$ of the driving amplifier 4 and the control terminal voltage v of the power amplifier 5. It can be seen from this figure that when the plus voltage $v_1$ controlled by the control signal mentioned hereinbefore varies in a range from 0 (volt) to $-(r_1/r_2) \cdot v_2$ where $v_2 < 0$, the voltage v changes within a range from $v_2/\{(r_2/r_1)+1\}$ (where $v_2 < 0$) to zero volt.

Now assuming, by way of example only, that $r_1$ is 20 k$\Omega$, $r_2$ is 4 k$\Omega$, $v_1$ is 5 volts and $v_2$ is $-5$ volts, then v is $-3.3$ volts, while when $r_1 = 20$ k$\Omega$, $r_2 = 4$ k$\Omega$, $v_1 = 0$ volt and $v_2 = -5$ volts, then $v = -4.2$ volts.

Figure 6:
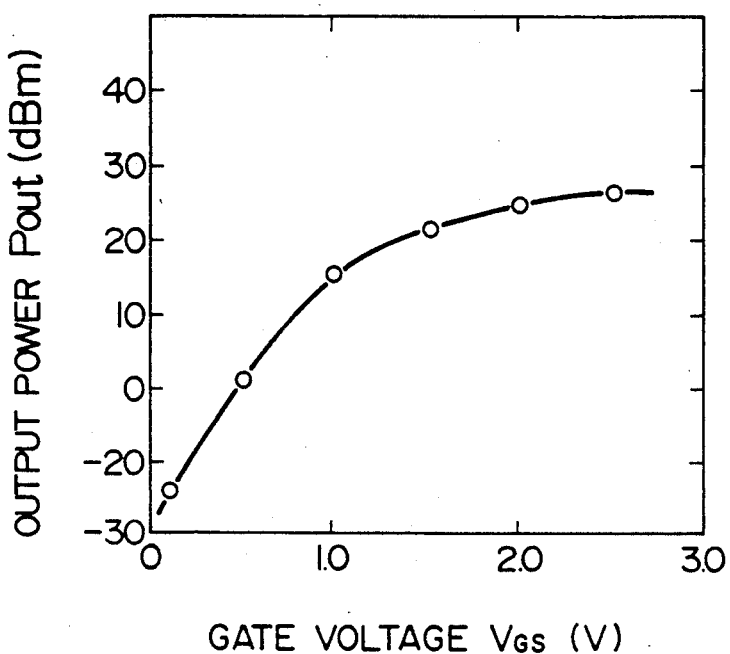
FIG. 6 is a view illustrating graphically a control characteristic of a driving amplifier realized by using a N-MOSFET element.
Figure 7:
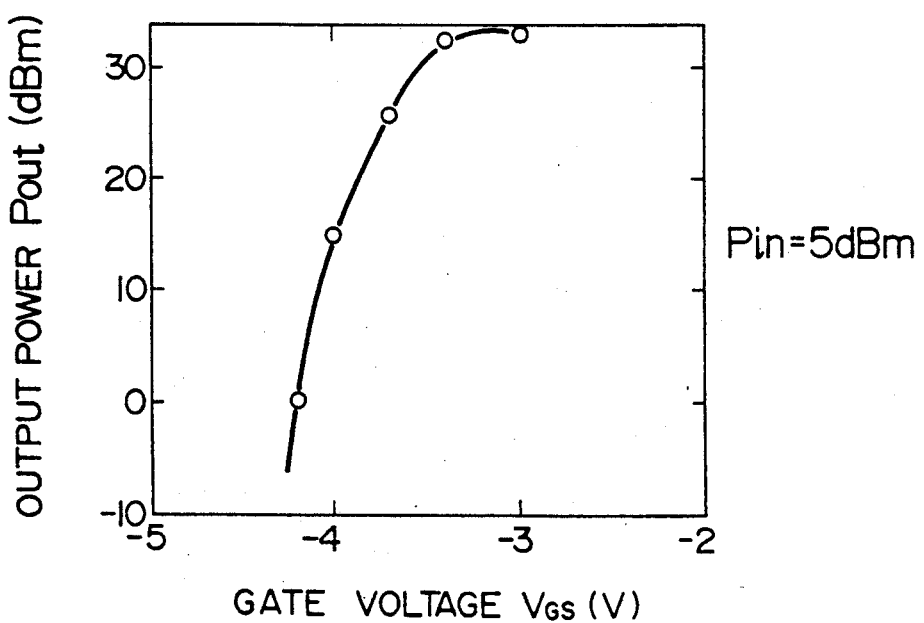
FIG. 7 graphically shows a control characteristic of a power amplifier realized by using a GaAs-FET.

In other words, when the control terminal voltage $v_1$ of the driving amplifier 4 varies from 0 to 5 volts, the control terminal voltage v of the power amplifier 5 varies from $-4.2$ volts to $-3.3$ volts, which means that the power control can be performed satisfactorily for both the driving amplifier 4 and the power amplifier 5, as illustrated in FIGS. 6 and 7.

As will now be appreciated from the foregoing description, it is advantageous to employ the GaAs-FET capable of exhibiting the high power conversion efficiency as the power amplifier having a great influence to the total power conversion efficiency (i.e. total additive efficiency) while using the inexpensive Si-element for realizing the driving amplifier exhibiting relatively low power conversion efficiency and exerting little influence to the overall power conversion efficiency.

Further, since it is possible according to the teaching of the present invention to control both the plus and minus source voltages with the only one control circuit, there can be provided the transmitter circuit offering the improved overall additive efficiency and inexpensiveness.

Figure 2:
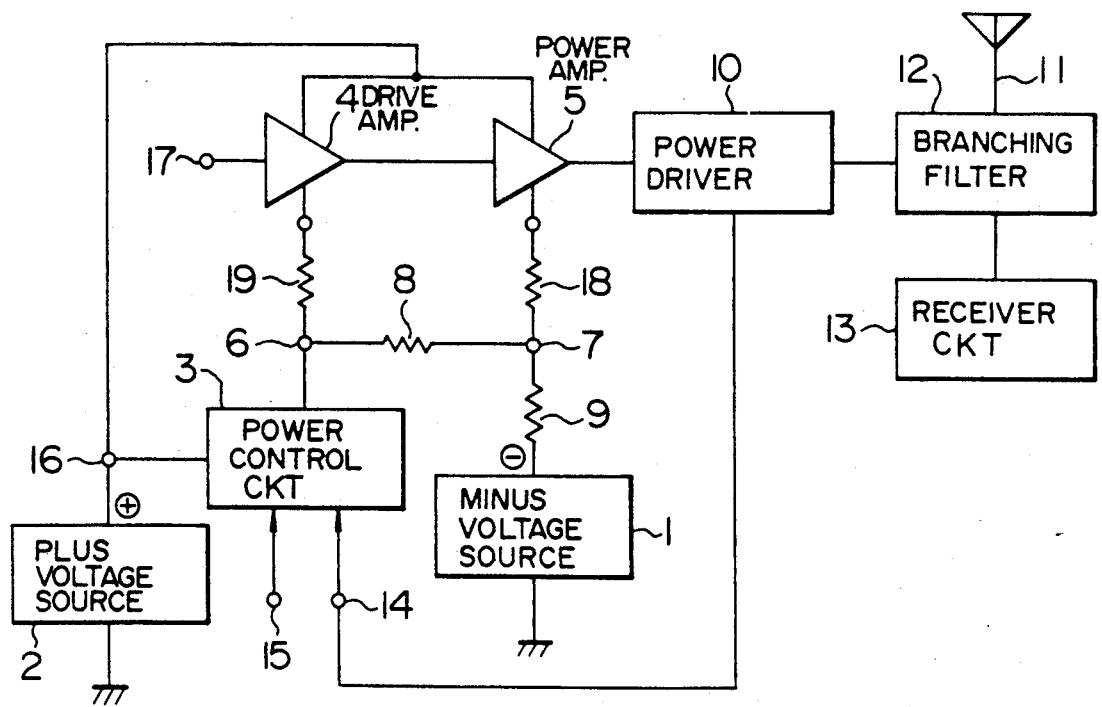
FIG. 2 is a block diagram showing another embodiment of the invention.

FIG. 2 shows in a block diagram another embodiment of the present invention which differs from the one shown in FIG. 1 in that resistors 18 and 19 are additionally connected to the control terminals 7 and 6 of the power control amplifier 5 and the driving amplifier 4, respectively. These resistors 18 and 19 are provided for adjusting the currents flowing to the associated control terminals 6 and 7, respectively.

Figure 3:
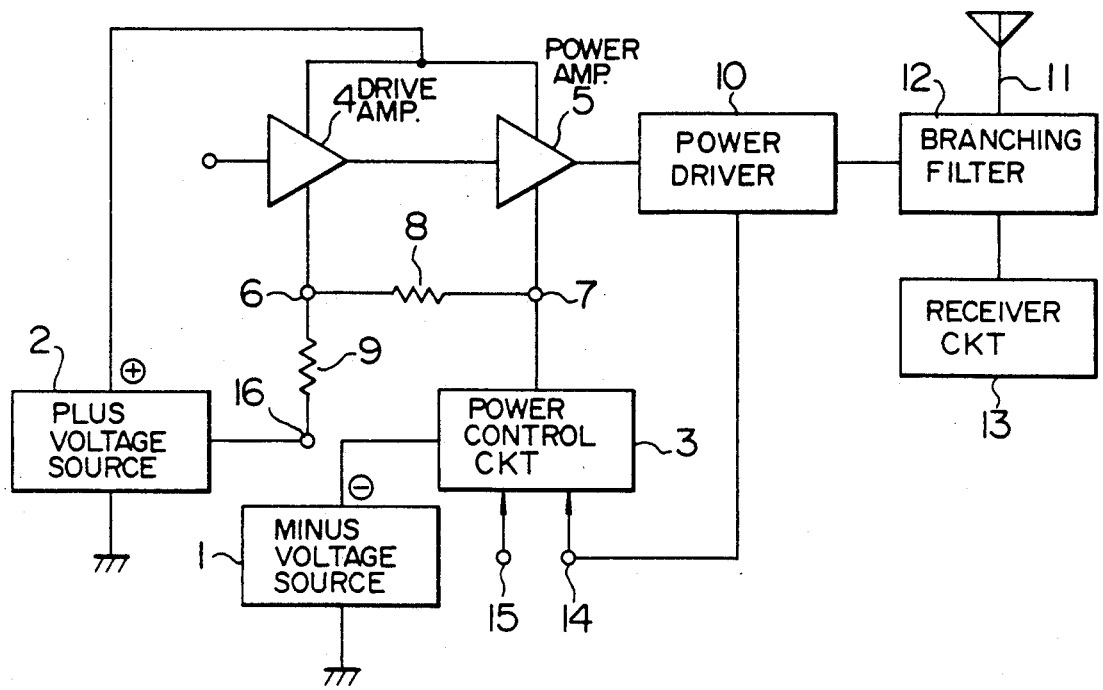
FIG. 3 is a block diagram showing still another embodiment of the invention.

FIG. 3 shows in a block diagram a further embodiment of the present invention which differs from the preceding embodiments in that the power controller circuit 3 is so arranged as to control the minus voltage.

As will now be appreciated from the foregoing description, there has been provided according to the present invention a transmitter circuit which is suited preferably for use in a portable radiotelephone and which can be implemented inexpensively and enjoy enhanced power conversion efficiency by virtue of that the driving amplifier is realized by using the inexpensive Si-element with a GaAs-FET being used for realizing the power amplifier in such circuit configuration that two control voltages of plus (positive) and minus (negative) polarities can be controlled.

We claim:

1. A transmitter circuit, comprising:
  a power amplifying circuit for power conversion of an input high frequency signal, wherein said power amplifying circuit includes a driving amplifier connected to a first power control line for controlling the output power of said driving amplifier by a plus voltage and a power amplifier connected to the output of said driving amplifier and connected to a second power control line for controlling the output power of said power amplifier by a minus voltage;
  a plus voltage circuit for supplying a plus voltage to said first power control line;
  a minus voltage circuit for supplying a minus voltage to said second power control line;
  voltage conversion means for interconnecting said first and second power control lines; and
  a power control circuit connected to at least one of said first and second power control lines and at least one of said plus voltage circuit and said minus voltage circuit for thereby controlling the output power of said power amplifying circuit.

2. A transmitter circuit according to claim 1, wherein said driving amplifier is comprised of a Si-MOSFET element and said power amplifier is comprised of a GaAs-FET element.

3. A transmitter circuit according to claim 2, wherein said Si-MOSFET element has a gate voltage variable in a range of 0 to 5 volts, and said GaAs-FET element has a gate voltage variable in a range of −4 to −3 volts.

4. A transmitter circuit according to claim 1, wherein said power control circuit is connected to said plus voltage circuit and to said first power control line for controlling the output power of said driving amplifier by the plus voltage.

5. A transmitter circuit according to claim 4, wherein said first power control line for controlling the power output of said driving amplifier by the plus voltage has a control terminal which is connected to said power control circuit.

6. A transmitter circuit according to claim 5, wherein said power control circuit has a plus voltage source terminal connected to said plus voltage circuit, an input terminal for a control signal representative of a power level commanded by a signal from a base station and a power input terminal for inputting a part of the output power of said power amplifier.

7. A transmitter circuit according to claim 1, wherein said power control circuit is connected to said minus voltage circuit and said second power control line.

8. A transmitter circuit according to claim 7, wherein said second power control line has a control terminal for said minus voltage which is connected to said power control circuit.

9. A transmitter circuit according to claim 8, wherein said power control circuit includes a minus voltage source terminal connected to said minus voltage circuit, an input terminal of a control signal representative of a power output level commanded by a signal from a base station, and an input terminal to which a part of the power outputted from said power amplifier is inputted.

10. A transmitter circuit, comprising:
a driving amplifier for power conversion of an input high frequency signal, said driving amplifier being comprised of a Si-FET element having a power conversion efficiency variable by a plus voltage and connected to a plus voltage power control line for applying said plus voltage;
a power amplifier connected to the output of said driving amplifier and comprised of a GaAs-FET element having a power conversion efficiency variable by a minus voltage and connected to a minus voltage power control line for applying said minus voltage;
a plus voltage circuit connected to said plus voltage power control line for supplying a plus voltage to said line;
a minus voltage circuit connected to said minus voltage power control line for supplying a minus voltage to said line;
power control means connected to said plus voltage circuit and said plus voltage power control line for controlling simultaneously the output power of said driving amplifier and that of said power amplifier; and
means for transmitting a high frequency signal power outputted from said power amplifier.

11. A transmitter circuit, comprising:
a driving amplifier for power conversion of an input high frequency signal, said driving amplifier being comprised of a Si-FET element having a power conversion efficiency variable by a plus voltage and connected to a plus voltage power control line for applying said plus voltage;
a power amplifier connected to the output of said driving amplifier and comprised of a GaAs-FET element having a power conversion efficiency variable by a minus voltage and connected to a minus voltage power control line for applying said minus voltage;
a plus voltage circuit connected to said plus voltage power control line for supplying a plus voltage to said line;
a minus voltage circuit connected to said minus voltage power control line for supplying a minus voltage to said line;
power control means connected to said minus voltage circuit and said minus voltage power control line for controlling simultaneously the output power of said driving amplifier and that of said power amplifier; and
means for transmitting a high frequency signal power outputted from said power amplifier.

* * * * *